US006938229B2

(12) United States Patent
Bowers et al.

(10) Patent No.: US 6,938,229 B2
(45) Date of Patent: Aug. 30, 2005

(54) METHOD AND APPARATUS FOR ANALYZING POST-LAYOUT TIMING VIOLATIONS

(75) Inventors: Heather Bowers, Oakland, CA (US); Frank Huang, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 106 days.

(21) Appl. No.: 10/310,073

(22) Filed: Dec. 4, 2002

(65) Prior Publication Data

US 2004/0111685 A1 Jun. 10, 2004

(51) Int. Cl.[7] .............................................. G06F 17/50
(52) U.S. Cl. .................................. 716/4; 716/5; 716/6
(58) Field of Search ..................................... 716/4, 5, 6

(56) References Cited

U.S. PATENT DOCUMENTS

| | | | | |
|---|---|---|---|---|
| 5,095,454 A | * | 3/1992 | Huang ........................... 703/19 |
| 5,355,321 A | * | 10/1994 | Grodstein et al. ................ 716/6 |
| 5,371,851 A | * | 12/1994 | Pieper et al. ................. 345/501 |
| 6,141,284 A | * | 10/2000 | Weinfurtner ................. 365/226 |
| 6,427,226 B1 | * | 7/2002 | Mallick et al. ................ 716/10 |
| 2003/0046280 A1 | * | 3/2003 | Rotter et al. .................... 707/6 |

* cited by examiner

*Primary Examiner*—A. M. Thompson
*Assistant Examiner*—Sun James Lin
(74) *Attorney, Agent, or Firm*—McAndrews, Held & Malloy, Ltd.

(57) ABSTRACT

A tool for analyzing timing violations reports is presented herein. The tool comprises a script which parses a log file containing any number of timing violation reports from a simulation of a layout design. The tool filters, consolidates, and sorts the timing violations and presents the foregoing in a report of consolidated timing violations. The report of consolidated timing violations can then be analyzed by a verification engineer.

14 Claims, 6 Drawing Sheets

210a
215a
Warning! Timing violation
    $width (negedge phi : 1617750 PS, : 1618340 PS, 0.60 : 600 PS );
    File: .../lib/verilog/sc/tsmc13hd_2.v, line = 33085
    Scope:
    tb_mem_dma_128MB_16bit_test.chip.core.bge_vdec.video_decoder_0_inst.cc_dec.DATA_EXTRACT_VALUE.fs
    _accum_reg_18_
215f    Time: 1618340 PS 210b
Warning! Timing violation
    $width (negedge phi : 1617750 PS, : 1618340 PS, 0.60 : 600 PS );
    File: .../lib/verilog/sc/tsmc13hd_2.v, line = 33085
    Scope:
    tb_mem_dma_128MB_16bit_test.chip.core.bge_vdec.video_decoder_0_inst.cc_dec.DATA_EXTRACT_VALUE.fs
    _accum_reg_9_
    Time: 1618340 PS 210c
Warning! Timing violation
    $width (negedge phi : 1617760 PS, : 1618340 PS, 0.60 : 600 PS );
    File: .../lib/verilog/sc/tsmc13hd_2.v, line = 33085
    Scope:
    tb_mem_dma_128MB_16bit_test.chip.core.bge_vdec.video_decoder_0_inst.vdec_np.vdec_sync_separator.of_sy
    ncsep_debug_data_reg_1_
    Time: 1618340 PS 210d
Warning! Timing violation
    $width (negedge phi : 1617760 PS, : 1618340 PS, 0.60 : 600 PS );
    File: .../lib/verilog/sc/tsmc13hd_2.v, line = 33085
    Scope:
    tb_mem_dma_128MB_16bit_test.chip.core.bge_vdec.video_decoder_0_inst.vdec_np.vdec_sync_separator.of_sy
    ncsep_debug_data_reg_3_
    Time: 1618340 PS

| WARNING TYPE | TIME OF CLOCK EVENT | TIME OF DATA EVENT | SETUP TIME LIMIT | HOLD TIME LIMIT | SCOPE | AMOUNT OF VIOLATION | # OF WARNINGS | TIME OF LAST WARNING | VIOLATING PIN | BIT POSITIONS | 1ST WARNING |
|---|---|---|---|---|---|---|---|---|---|---|---|
| 315a | 315b | 315c | 315d | 315e | 315f | 315g | 315h | 315i | 315j | 315k | 315l |

METHOD AND APPARATUS FOR ANALYZING POST-LAYOUT TIMING VIOLATIONS

RELATED APPLICATIONS

[Not Applicable]

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

The present invention is directed to integrated circuit design verification, and more particularly to a system, method, and apparatus for analyzing post layout timing violations.

Simulation programs are frequently used for testing integrated circuits. Integrated circuit production is characterized by high initial costs for the production of the first "copy" followed by low marginal costs for each successive copy. Testing of a design for an integrated circuit prior to production is almost imperative.

The design timing verification starts with the delivery of a design layout of the integrated circuit. A design layout is a functional and timing representation of the design of an integrated circuit. The design layout starts from an implementation description of the functionality that is synthesized from a behavioral language description. During design verification, a design layout is tested for operational errors. The operational errors are then used to diagnose any errors in the design layout and modify the design layout. The modified design layout is then retested. The testing and debugging cycle continue until a design layout is developed which meets the design verification requirements. The final design layout is then used for production of integrated circuits.

The design layouts are tested by simulating the operation of the design layouts. The operation of the design layouts is simulated by what are known as simulation tools. One of the most popular simulation tools is known as the Verilog™ simulator. The Verilog™ simulator performs a variety of simulations which test various aspects of the integrated circuit, including timing simulations.

Timing simulations are used to test the synchronization of the design layout. One area of testing tests the arrival of signals at flip-flops. In an integrated circuit, latches are characterized by a clocked input which is controlled by a clock. The clock generates a clock signal with a brief pulse at predetermined time intervals. The input signals must arrive prior to the clock signal. If the signal arrives after the clock signal, the latch will not recognize the input. To avoid the foregoing problem, a design layout is simulated. When an input signal does not arrive at the expected time during the simulation, a timing violation occurs. The foregoing simulation is known as a post-layout gate level back annotated simulation.

The timing violations during a post-layout gate level back annotated simulation are reported in a log file. The log file includes records which indicate various information related to each timing violation, such as the time, location, and type of timing violation. The log file can then be analyzed by a verification engineer to modify the design layout.

Analysis of the log file is very time consuming. There are usually an extremely high number of timing violations reported in the log file. Many of the high number of timing violations are either not useful for diagnostic purposes or redundantly indicate a problem. Additionally, the timing violations are not sorted in a manner that is useful for debugging. As a result, analysis of the timing violations is done on a brute force violation-by-violation basis. Due to the lack of organization of the timing violations, overall trends are hard to identify from individual timing violations, because the individual timing violations are sparsely located throughout the log file.

Accordingly, it would be advantageous if a tool for analyzing timing violations is provided. Further limitations and disadvantages of conventional and traditional approaches will become apparent to one of skill in the art, through comparison of such systems with embodiments presented in the remainder of the present application with references to the drawings.

BRIEF SUMMARY OF THE INVENTION

Presented herein is a method, and apparatus for analyzing timing violations which are generated during post-layout gate level back annotated simulations. The log file generated by a post-layout gate level back annotated simulator is parsed by a script. The script uses a combination of filtering, consolidating, and sorting to generate a report of consolidated timing violations. The report of consolidated timing violations presents information about the timing violations which is more concise, better organized, and from which it is easier to identify trends.

Numerous timing violations occur shortly after a simulated power on or system reset. These particular timing violations are usually not indicative of design errors in the design layout. Nevertheless, these timing violations are among the many that are reported in the log file by the simulator. The script filters the log file and disregards any timing violations which are found to occur within a predetermined time interval after a simulated power-on or system reset. This reduces the number of timing violations which must be sifted through during debugging.

Many timing violations indicate redundant information. For example, a bus violating a timing width specification results in most, if not all, of the bits of the bus to have a timing violation. A timing violation is recorded in the log file for each of the bits. In the case of a 32-bit bus, it is possible for 32 timing violations to be reported. The script searches for and consolidates the information regarding substantially contemporaneous timing violations occurring with respect to the same module of the circuit. In the report of consolidated timing violations, the consolidated information is presented in one entry.

Presentation of consolidated information regarding substantially contemporaneous timing violations at the same module results in a report which is organized on a module-by-module basis. Organization on a module-by-module basis makes trend identification easier because timing violations which are sparsely located throughout the log file are represented together in a single entry.

These and other advantages and novel features of the embodiments in the present application will be more fully understood from the following description and drawings.

BRIEF DESCRIPTION OF SEVERAL VIEWS OF THE DRAWINGS

FIG. 2 is a block diagram of an exemplary log file containing timing violation reports;

FIG. 3 is a global array in accordance with an embodiment of the present invention;

DETAILED DESCRIPTION OF THE INVENTION

Figure 1:
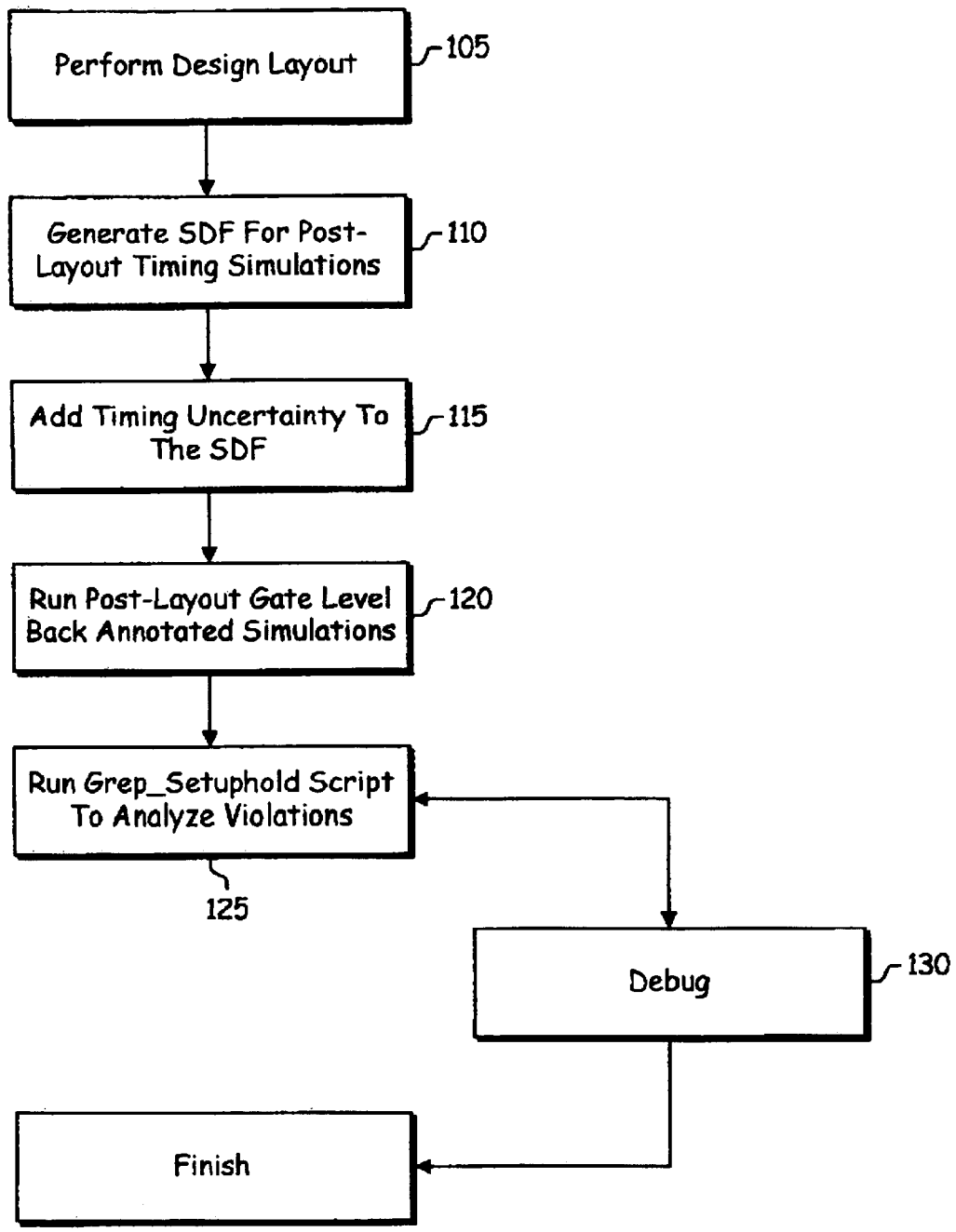
FIG. 1 is a flow diagram describing an exemplary design verification process wherein the present invention can be practiced.

Referring now to FIG. 1, there is illustrated a flow diagram describing an exemplary design verification process wherein the present invention can be practiced. The process begins with the delivery (105) of a design layout. A design layout is a representation of the design of an integrated circuit, as well as the layout of the design on a substrate.

After the design layout is developed, a simulation tool is used to calculate (110) the timing data for the design layout. The calculated timing data is stored in a timing data file in a predetermined format, such as the IEEE Standard Delay Format (SDF) P1497, which is incorporated by reference herein. The calculated timing data includes calculated propagation delays between various elements in the design layout. The calculated propagation delays are based on various factors including the physical distance that a signal must travel on the integrated circuit. Since the calculated timing data is not based on empirical data, a degree of deviation may exist between the calculated timing data and the actual propagation delay, when the integrated circuit is actually made. Therefore a safety margin (115) may be added to the timing data file prior to simulating the design layout.

A post-layout gate level back annotated simulation (120) is then conducted for the design layout using the data in the timing data file by a simulator. The post-layout gate level back annotated simulation generates a log file of all timing violations which occurred during the simulation. For example, a setup timing violation occurs when an expected signal has not arrived at its destination at the time required A hold timing violation occurs when a signal is not held stable for a sufficient amount of time after the data is examined. A width violation is a violation of the width requirement for a pulse, which is usually indicative of a glitch.

Referring now to FIG. 2, there is illustrated an exemplary log 205 containing timing violation reports 210. Each timing violation report 210 reports various information about a particular timing violation. The timing violation report 210 includes the warning type 215*a*, time of the clock event 215*b*, time of the data event 215*c*, setup time limit 215*d*, hold time limit 215*e*, and scope 215*f*.

In this example, the timing violation reported by timing violation report 210*a* occurred at bit 18 of accum_reg at time, T, T=1617750 pS, the timing violation reported by timing violation report 210*b* occurred at bit 9 of accum_reg at T=1617750 pS, the timing violation reported by timing violation report 210*c* occurred at bit 1 of debug_data_reg at T=1617760 pS, and the timing violation reported by timing violation report 210*d* occurred at bit 3 of accum_reg at T=1617760 pS.

Analysis of the log file 205 is time consuming. A typical log file can include thousands of timing violation reports 210. Many of the timing violations are associated with the same design element. For example, timing violation report 210*a* and 210*b* are associated with timing violations which happened at bits 18 and 9, respectively, of accum_reg at the same time. A bus committing a timing violation is frequently characterized by timing violations for most, if not all, of the constituent lines of the bus. If a 32-bit bus commits a timing violation, potentially 32 timing violation reports 210 are generated. Additionally, a great number of timing violations normally occur immediately after a simulated power-on or system reset. Although these violations are not indicative of any error in the design layout, the timing violations are among the many timing violations which are reported in the log file.

Referring again to FIG. 1, at 125, the log file is parsed by a script, thereby generating a report of consolidated timing violations. The report of consolidated timing violations presents the information regarding the timing violations in a more concise and organized manner to facilitate diagnostics and debugging (130) of the design layout.

The script uses a global array to filter, consolidate, and sort the timing violations of the log file 200. The contents of the global array are then presented in a report of consolidated timing violations. Referring now to FIG. 3, there is illustrated a block diagram of an exemplary global array 305. The global array 305 includes a plurality of records 310. Each record 310 includes fields for warning type 315*a*, time of clock event 315*b*, time of data event 315*c*, setup time limit 315*d*, hold time limit 315*e*, scope 315*f*, amount of violation 310*g*, number of warnings 315*h*, time of last warning 315*i*, name of the violating pin on violating flip-flop 315*j*, bit positions on a bus reporting timing violations 315*k*, and time of first warning 315*l*. The fields 315*a*–315*f* relate directly to the warning type 215*a*, time of clock event 215*b*, time of data event 215*c*, setup time limit 215*d*, hold time limit 215*e*, and scope 215*f*. As the script parses the log file 205, the script records information 215*a*–215*f* about the timing violations 210, in the fields 315*a*–315*f* of the global array.

The remaining fields, 315*g*–315*l*, are metrics calculated by the script. The violation time 315*g* is the difference between the budgeted time and the actual time, and is calculated from the limits (setup or hold) and the difference in time between the clock and data events. The number of warnings 315*h*, time of the last warning 315*i*, bit position 315*k*, and time of first warning 315*l* are used by the script to report consolidated information regarding multiple timing violations that occur at a particular module, for example, a bus.

As noted above, a large number of substantially contemporaneous timing violations 210 in a particular module can be the result of a single cause. Reporting consolidated information about substantially contemporaneous timing violations 210 in a particular module, advantageously reduces the number of records which the verification engineer must analyze, and presents a trend of timing violations which is useful for diagnostic purposes.

Figure 4:
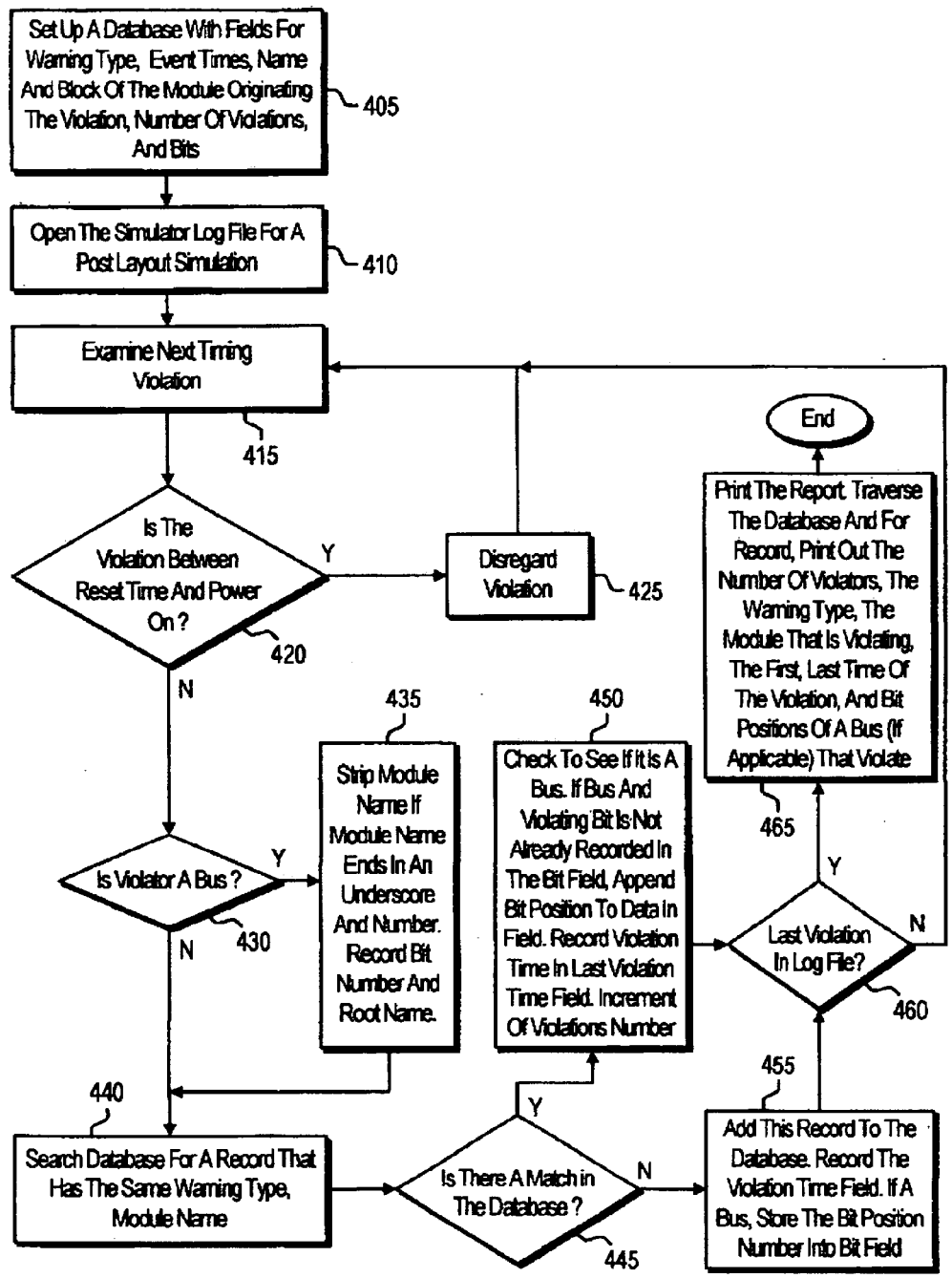
FIG. 4 is a flow diagram describing timing violation report consolidation in accordance with an embodiment of the present invention.

Referring now to FIG. 4, there is illustrated a flow diagram describing the operation of the script. At 405, the script sets up a data structure for the global array. At 410, the script opens the log file 205 generated by the post layout simulation and begins parsing the violations. At 415, the script examines the next timing violation in the log file 205. As noted above, numerous timing violations 210 are reported immediately after system reset which are not indicative of design layout errors. These timing violations 210 are filtered by determining if the timing violation occurred within the predetermined time from system startup (420). In the case where the timing violation occurred within the predetermined time from system startup, the timing violation 210 is disregarded (425) and not recorded in the global array 305.

If the timing violation 210 is not within the predetermined time interval from a system reset during 420, the script examines the timing violation 210 to determine whether the timing violation occurred at a bus (430). In the case where the timing violation occurred at a bus during 425, the bit position is separated (435) from the scope 215f. The scope for a bus bit usually is denoted by a suffix which includes an underscore followed by a number indicating the bit position. Removal of the suffix for bus bits from the scope of a bus bit insures that all of the different bits on the bus will have the same scope. In the case where the timing violation did not occur at a bus, 435 is bypassed.

At 440, the scope of the timing violation 210 is searched among all of the previous entries in the scope field 315f in the previous records 310 stored in the global array 305 to correlate the present timing violation with information about other timing violations occurring at the same scope. If at 445, another record 310 is found with the same scope field 315f as the present timing violation 210, the record 310 is updated (450).

The record 310 is updated (450) by incrementing the number of warnings field 315h, and storing the time of the data event 215c in the time of last warning field 315i. Additionally, if the timing violation 210 pertains to a bus, the bit position which was separated from the scope is appended to the bit positions field 315k.

If at 445, another record 310 is not found with the same scope field 315f as the present timing violation 210, a record 310 is added (455) to the global array. The information 215a–215f is recorded at fields 315a–315f. The timing violation field 315g is calculated from the setup times 315d, the hold times 315e and the difference in time between the clock 315b and data events 315c. The number of warnings is set to 1. The time of the first warning and the time of the last warning are both set to the time of data event 215c.

After 450 or 455, a determination is made at 460 whether the timing violation 210 is the last timing violation in the log file 405. In the case where the timing violation 210 is not the last timing violation in the log file 405 during 460, 415–460 are repeated for the next timing violation 210 in the log file 205. In the case where the present timing violation 210 is the last timing violation in the log file 205, a report of consolidated timing violations is prepared at 465 for use by the verification engineer.

Figure 5:
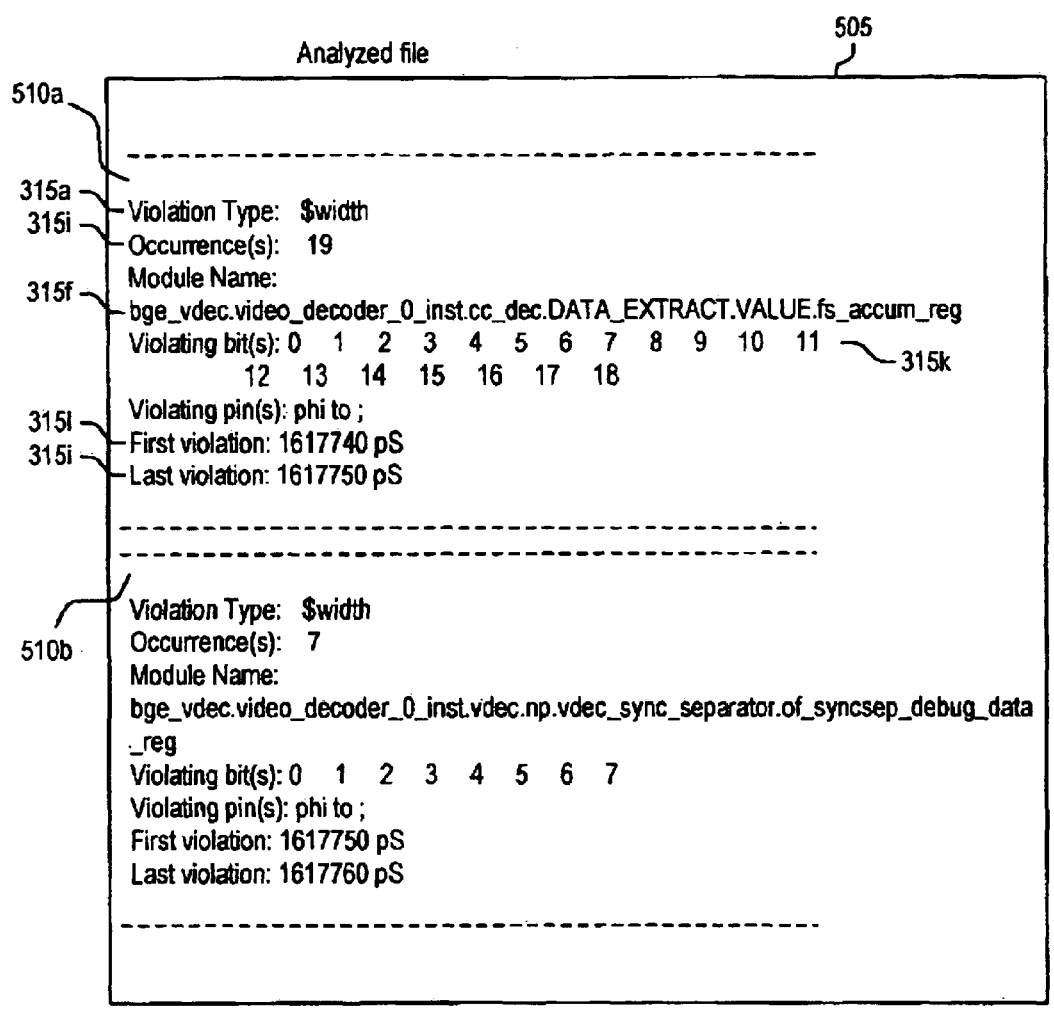
FIG. 5 is an exemplary timing violation report in accordance with the present invention.

Referring now to FIG. 5, there is illustrated an exemplary report of consolidated timing violations 505. The report includes the violation type 315a, the number of warnings 315i, the scope 315f, the bit positions 315k, if pertaining to a bus, the time of the first violation 315l and the time of the last violation 315i. In the case of a bus, the scope 315f that is reported is the original scope separated from the suffix.

In the illustrated example, the first entry 510a in the report of consolidated timing violations 505, reports that 19 timing violations occurred at the bus "accum_reg", at bit positions 0–18, between T=1617740 pS, and 1617750 ps. The entry 510b reports that 7 timing violations occurred at the bus "data_reg", at bit positions 0–7, between T=1617750 pS to 1617760 pS.

As can be seen, analysis of the report of consolidated timing violations 505 is less time consuming than the log file 205. First, timing violations 210 which occurring within a predetermined amount of time after a simulated power-on or reset are filtered from the report of consolidated timing violations 505. Secondly, the timing violations 210 are reported on a consolidated basis for common modules, such as a bus. This significantly reduces the number of records 310 which must be analyzed. Thirdly, because the timing violations 210 are consolidated by module, the report of consolidated timing violations 505 presentation of the information regarding the timing violations is organized on a module-by-module basis.

Recordation of the first 315l and last timing violation 315i times and the number of violations 315i can be also be useful in debugging. By examining the first 315l and last timing violation 315i times and the number of violations 315i, a design engineer can determine whether the timing violations were localized in time or cyclical in nature. For example, where the timing violations are localized in time, the violations may be indicative of problems associated with programming a register. Timing violations which are cyclical in nature are indicative of problems associated with a clock.

Organization on a module-by-module basis allows for easier identification of a trend from a individual timing violations 210. For example, those skilled in the art will recognize that both the entries 510a and 510b are indicative of buses violating a width timing specification due to the high number of bits in errors at substantially the same time. Also, because both buses violated the width timing specification at substantially the same times, it is likely that a clock glitch occurred in the vicinity of the buses.

Figure 6:
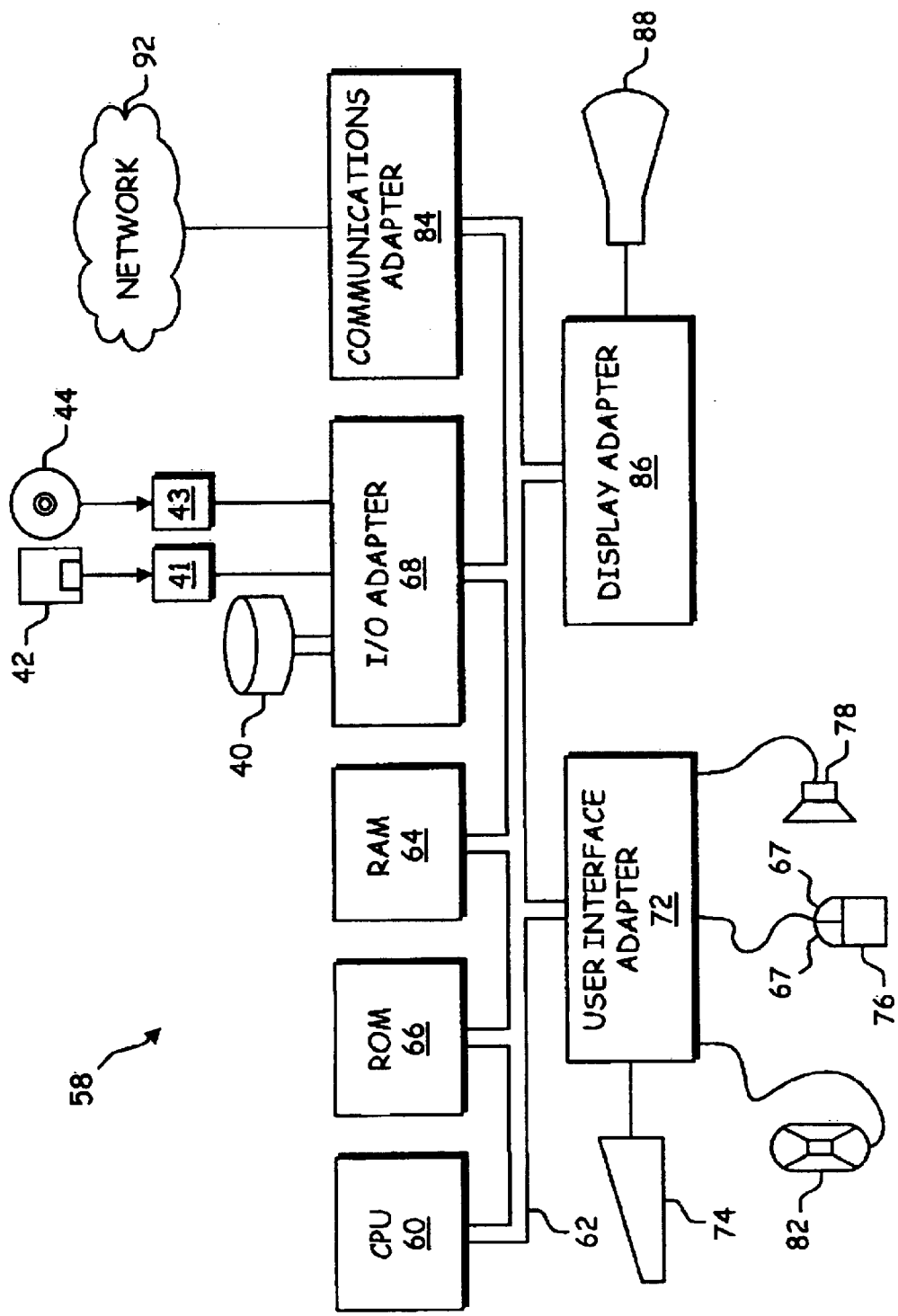
FIG. 6 is a block diagram of an exemplary hardware environment wherein the present invention can be practiced.

Referring now to FIG. 6, a representative hardware environment for a computer system 58 for practicing the present invention is depicted. A CPU 60 is interconnected via system bus 62 to random access memory (RAM) 64, read only memory (ROM) 66, an input/output (I/O) adapter 68, a user interface adapter 72, a communications adapter 84, and a display adapter 86. The input/output (I/O) adapter 68 connects peripheral devices such as hard disc drives 40, floppy disc drives 41 for reading removable floppy discs 42, and optical disc drives 43 for reading removable optical disc 44 (such as a compact disc or a digital versatile disc) to the bus 62. The user interface adapter 72 connects devices such as a keyboard 74, a mouse 76 having a plurality of buttons 67, a speaker 78, a microphone 82, and/or other user interfaces devices such as a touch screen device (not shown) to the bus 62. The communications adapter 84 connects the computer system to a network 92. The display adapter 86 connects a monitor 88 to the bus 62.

The communications adapter 84 connects the computer system 58 to other computers systems 58 over network 92. The computer network 92 can comprise, for example, a local area network (LAN), a wide area network (WAN), or the internet. Additionally, a particular one of the computer systems 58s can act as a server. A computer server 58a centralizes files and functions and provides access to the files and functions to the other computer systems 58 within the network 92.

An embodiment of the present invention can be implemented as sets of instructions resident in the random access memory 64 of one or more computer systems 58 configured generally as described in FIG. 6. Until required by the computer system 58, the set of instructions may be stored in another computer readable memory, for example in a hard disc drive 40, or in removable memory such as an optical disc 44 for eventual use in an optical disc drive 43, or a floppy disc 42 for eventual use in a floppy disc drive 41.

Those skilled in the art will recognize that the physical storage of the sets of instructions physically changes the medium upon which it is stored, electrically, magnetically, chemically, or mechanically, so that the medium carries computer readable information.

While the invention has been described with reference to certain embodiments, it will be understood by those skilled in the art that various changes may be made and equivalents may be substituted without departing from the scope of the invention. In addition, many modifications may be made to adapt particular situation or material to the teachings of the invention without departing from its scope. For example, the flow diagram of FIG. 4 can be implemented as a series of instructions residing in a memory for execution by a processor. Therefore, it is intended that the invention not be limited to the particular embodiment(s) disclosed, but that the invention will include all embodiments falling within the scope of the appended claims.

What is claimed is:

1. A method for simulating an integrated circuit, said method comprising:
   consolidating a plurality of records of timing violations, wherein each of said plurality of records reports a timing violation for a same bus in a simulated integrated circuit, by separating a suffix from a module name for the bus; and
   generating a report based on said consolidating, wherein said report comprises one record which includes information from the plurality of records.

2. The method of claim 1, further comprising recording bits of said bus within timing violations.

3. The method of claim 1, further comprising recording a time where a first timing violation occurs and recording a time where a last timing violation occurs for the plurality of records.

4. The method of claim 1, wherein consolidating a portion of the plurality of records further comprises:
   consolidating the plurality of records of timing violations, wherein each of said plurality of records reports a timing violation during a predetermined time interval.

5. The method of claim 1, further comprising:
   filtering timing violations occurring within a predetermined period of time after a simulated power-up or system reset.

6. An article of manufacture comprising computer readable medium, wherein the computer readable medium stores a plurality of executable instructions, and wherein the plurality of executable instructions cause:
   consolidating a plurality of records of timing violations, wherein each of said plurality of records reports a timing violation for a same bus in a simulated integrated circuit by separating a suffix from a module name for the bus; and
   generating a report based on said consolidating, wherein said report comprises one record which includes information from the plurality of records.

7. The article of manufacture of claim 6, wherein the plurality of instructions further cause recording bits of said bus within timing violations.

8. The article of manufacture of claim 6, wherein the plurality of instructions further cause recording a time where a first timing violation occurs and recording a time where a last timing violation occurs for the plurality of records.

9. The article of manufacture of claim 6, wherein consolidating the plurality of records further comprises:
   consolidating the plurality of records of timing violations, wherein each of said plurality of records reports a timing violation during a predetermined time interval.

10. The article of manufacture of claim 6, wherein the plurality of instructions further cause filtering timing violations occurring within a predetermined period of time after a system reset.

11. A method for analyzing timing violations, said method comprising:
    examining a scope associated with each of a plurality of timing violations;
    comparing the scope associated with each of the plurality of timing violations to a scope associated with each of a plurality of records in an array;
    updating one of the records in the array, wherein a particular scope associated with a particular one of the plurality of the timing violations is the same as a scope associated with said one of the records in the array; and
    adding a record to the array for the particular timing violation, wherein the particular scope associated with the particular timing violation does not match any of the scopes associated with any of the records in the array.

12. The method of claim 11, further comprising:
    determining whether the particular one of the plurality of timing violations is associated with a bus; and
    removing a suffix from the scope, wherein the particular one of the timing violations is associated with the bus.

13. An article of manufacture comprising computer readable medium, wherein the computer readable medium stores a plurality of executable instructions, and wherein the plurality of executable instructions cause:
    examining a scope associated with each of a plurality of timing violations;
    comparing the scope associated with each of the plurality of timing violations to a scope associated with each of a plurality of records in an array;
    updating one of the records in the array, wherein a particular scope associated with a particular one of the plurality of the timing violations is the same as a scope associated with said one of the records in the array; and
    adding a record to the array for the particular timing violation, wherein the particular scope associated with the particular timing violation does not match any of the scopes associated with any of the records in the array.

14. The article of manufacture of claim 13, wherein the plurality of instructions cause:
    determining whether the particular one of the plurality of timing violations is associated with a bus; and
    removing a suffix from the scope, wherein the particular one of the timing violations is associated with the bus.

* * * * *